(12) United States Patent
Abbaszadeh et al.

(10) Patent No.: US 6,304,614 B1
(45) Date of Patent: Oct. 16, 2001

(54) DIFFERENTIAL CODEC FOR PRAGMATIC PSK TCM SCHEMES

(75) Inventors: Ayyoob D. Abbaszadeh, Salt Lake City; Dale D. Fonnesbeck, Kaysville, both of UT (US)

(73) Assignee: L-3 Communications Corp., New York, NY (US)

( * ) Notice: Subject to any disclaimer, the term of this patent is extended or adjusted under 35 U.S.C. 154(b) by 0 days.

(21) Appl. No.: 09/185,210

(22) Filed: Nov. 3, 1998

Related U.S. Application Data

(60) Provisional application No. 60/064,158, filed on Nov. 4, 1997.

(51) Int. Cl.$^7$ .................................. H04L 1/00; H04L 7/02
(52) U.S. Cl. ............................................. 375/279; 375/265
(58) Field of Search ..................................... 375/279, 265, 375/280, 340, 147, 265 RC

(56) References Cited

U.S. PATENT DOCUMENTS

| | | | |
|---|---|---|---|
| 5,757,856 | * | 5/1998 | Fang ....................... 375/265 |
| 5,878,085 | * | 3/1999 | McCallister et al. ................ 375/280 |
| 5,995,551 | * | 11/1999 | McCallister et al. ................ 375/265 |
| 6,125,136 | * | 9/2000 | Jones et al. ........................... 375/147 |

* cited by examiner

*Primary Examiner*—Chi Pham
*Assistant Examiner*—Dung X. Nguyen
(74) *Attorney, Agent, or Firm*—Perman & Green, LLP

(57) ABSTRACT

A system including coding and decoding circuits provides for resolution of the phase ambiguities in pragmatic trellis-coded PSK modulation transmissions. An error correcting coder, such as a convolutional encoder, precedes the modulator for reducing the effect of noise in inducing phase errors. A corresponding decoder appears at the reception end of the communication system. A differential encoder and decoder automatically remove the possible phase ambiguities, and operate in conjunction with the error correcting encoder and decoder. Each of the ambiguity-removal differential encoder and the decoder act as an operator upon its input signal. In order that both the error correcting encoder and the ambiguity encoder immediately precede the modulator, the ambiguity removal circuitry is placed between the error correcting encoder, and is constructed as a combination of differential encoder and inverse differential encoder. The use for ambiguity removal of both the differential encoder and the inverse differential encoder operates to remove the phase ambiguity while making the ambiguity operation transparent to the output of the error correction encoder. This retains the benefit of placing the error correcting encoder immediately before the modulator.

12 Claims, 11 Drawing Sheets

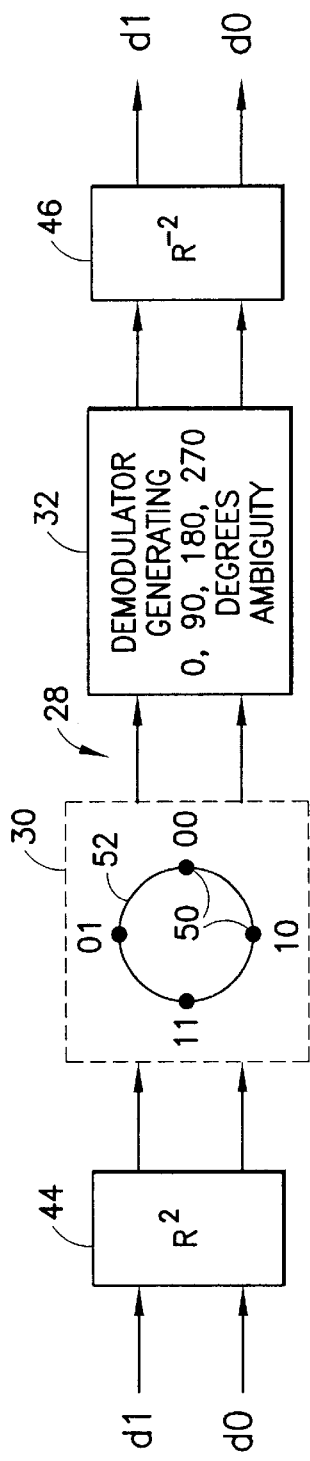
FIG. 2
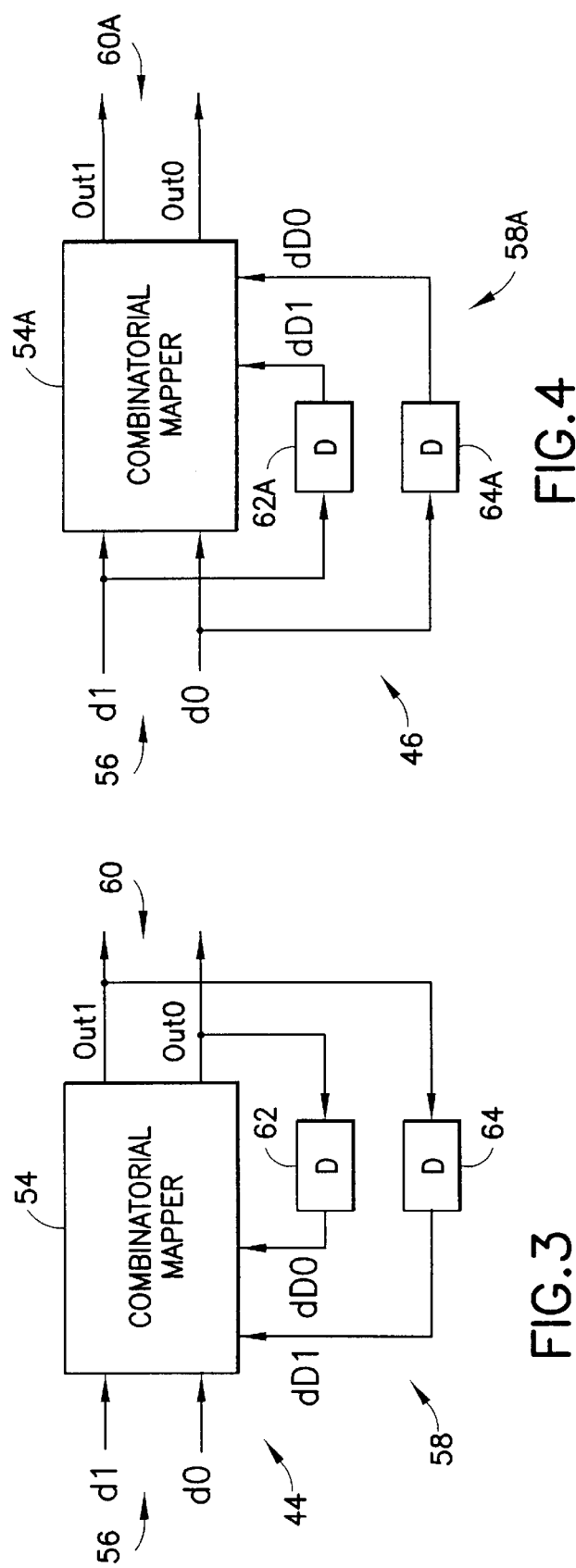
FIG. 4
FIG. 3

DIFFERENTIAL CODEC FOR PRAGMATIC PSK TCM SCHEMES

CROSS-REFERENCE TO RELATED APPLICATION

This application claims the benefit of U.S. Provisional Application No. 60/064,158, filed Nov. 4, 1997.

"STATEMENT OF GOVERNMENT RIGHTS

This invention was made with government support under contract number F09604-96-C-0011 awarded by the United States Air Force. The government has certain rights in this invention."

BACKGROUND OF THE INVENTION

This invention relates to the transmission of digitally formatted data via a communication system employing a carrier modulated with phase shift keying (PSK) and, more particularly, to removal of phase ambiguities introduced in the analog signal transmission of the communication system for the case of modulation of the digitally formatted data by trellis coded modulation with Viterbi decoders.

A typical communication system includes a transmitter having an oscillator for generation of a carrier, and a receiver having an oscillator employed in reception of the carrier. A modulator within the transmitter is operative to modulate the carrier with a modulation such as phase shift keying, and a demodulator in the receiver is operative to demodulate the modulated carrier to extract data transmitted via the communication system. Such a communication system may be subject to phase ambiguities with consequent errors in the signal transmission, due to the presence of noise at the transmission end and/or the reception end of the communication system. Resolution of phase ambiguity in trellis coded modulated data is disclosed in U.S. Pat. Nos. 5,428,631 of Zehavi and 5,233,630 of Wolf which employ various types of encoding and decoding to resolve the phase ambiguity. Each of these patents also disclose components of a communication system with coding and decoding of Mary PSK modulated signals.

With the wide use of such communication systems in radio-telephony and in other areas which can benefit from a minimization of size and complexity of the electronic equipment, it is desirable to reduce the complexity of the circuitry. A problem arises in that the coding and decoding circuitry of the foregoing communication system is greater than that which is desired.

SUMMARY OF THE INVENTION

This invention provides a system including coding and decoding circuits for resolution of the foregoing phase ambiguities by a methodology which attains a simplification of circuitry from that employed in existing systems. In a typical M-ary PSK modulation communication system, an oscillator providing a carrier and a modulator of phase of the carrier are located at the transmission end of the communication system, and further oscillator or carrier recovery circuitry in conjunction with phase demodulation circuitry are located at the reception end of the communication system. An error correcting coder, such as a convolutional encoder, precedes the modulator for reducing the effect of noise in inducing phase errors. A corresponding decoder appears at the reception end of the communication system. The invention employs, as an ambiguity removal circuit, a differential encoder and decoder which automatically remove the possible phase ambiguities, and operate in conjunction with the error correcting encoder and decoder. Each of the ambiguity-removal differential encoder and the decoder act as an operator upon its input signal.

In the practice of the invention, it is recognized that both the error correcting encoder and the ambiguity encoder should immediately precede the modulator. The invention meets this challenge by placing the ambiguity removal circuitry between the error correcting encoder and modulator, and by constructing the ambiguity removal circuitry as a combination of differential encoder and inverse differential encoder. The use for ambiguity removal of both the differential encoder and the inverse differential encoder operates to remove the phase ambiguity while making the ambiguity operation transparent to the output of the error correction encoder. This retains the benefit of placing the error correcting encoder immediately before the modulator.

As a further feature of the invention, the ambiguity encoder with its inverse ambiguity encoder are located at the transmitting end of the communication system, and a corresponding decoder and its inverse decoder are located at the reception end of the communication system. In the ambiguity removal circuit, the encoder function may be accomplished by a mapper (such as a read-only memory) in combination with feedback signal delays, and the decoder comprises a mapper in combination with feed-forward signal delays.

In accordance with another feature of the invention, it has been observed that, in a PSK communication system such as 4-PSK or 8-PSK, the inverse encoder function need be placed only on one of the lower bits, and is not necessary for the higher bits. A simplification of the inverse function can then be obtained by means of simply a one-dimensional differential encoder following the error correcting encoder. Further simplification of the circuitry at both the transmission end and the reception end by replacing the mapper in each of the differential encoder and decoder with circuitry having logic gates.

BRIEF DESCRIPTION OF THE DRAWING

The aforementioned aspects and other features of the invention are explained in the following description, taken in connection with the accompanying drawing figures wherein:

FIG. 2 shows diagrammatically modulation and demodulation portions of a communication system with rotationally invariant uncoded quadrature PSK;

FIG. 3 is a block diagram of an operator of FIG. 2 serving to remove phase ambiguities;

FIG. 4 is a block diagram of an inverse operator of FIG. 2 serving to remove phase ambiguities;

Identically labeled elements appearing in different ones of the figures refer to the same element but may not be referenced in the description for all figures.

DETAILED DESCRIPTION OF THE INVENTION

Figure 1A:
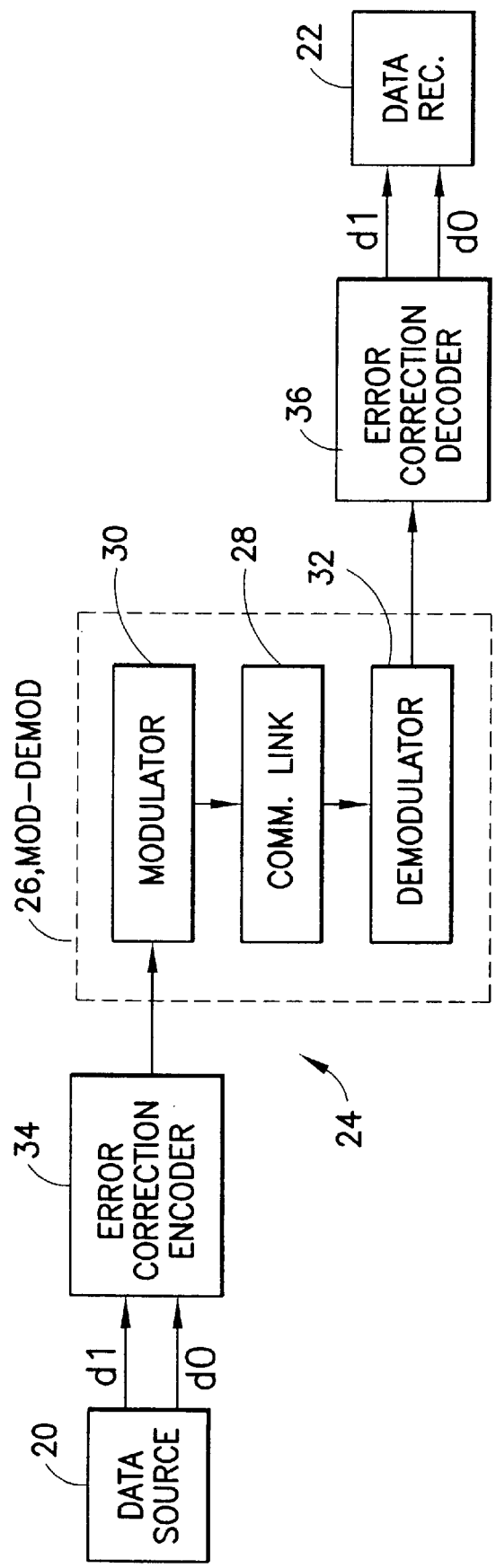
FIG. 1A shows diagrammatically a PSK communication system with error correction coding, but without correction of phase ambiguities.

In FIG. 1A, binary data d1, do originating at a data source 20 is transmitted to a data receiver 22 by a communication system 24 using 8 PSK trellis coded modulation scheme. The communication system 24 operates with an M-ary PSK modulation which, by way of example, is shown transmitting 2-bit binary characters employing a pragmatic trellis-coded modulation scheme. A modulator-demodulator block (mod-demod) 26 provides for a communication link 28. Signals to be transmitted via the link 28 are phase modulated by modulator 30 onto a carrier provided by an oscillator (not shown). Signals, upon completing passage along the link 28, are demodulated at demodulator 32 also shown within the mod-demod block 26. A signal from the data source 20, before being applied to the modulator 30, is processed by an error correction encoder 34. Signals outputted by the demodulator 32 pass through an error correction decoder 36 enroute to the receiver 22. The error correction decoder 36 compensates for any changes in the characteristics of the data stream which may be introduced by the error correction encoder 34 so as to provide for the error correction function while being transparent to the flow of data between the source 20 and the receiver 22. No provision is provided in the communication system 24 for correction of phase ambiguities such as a shift of 90 degrees induced by noise. Optimum operation of the correction encoder 34 requires that the encoder 34 be placed immediately before the modulator 30, and optimum operation of the correction decoder 36 requires that the decoder 36 be placed immediately after the demodulator 32.

Figure 1B:
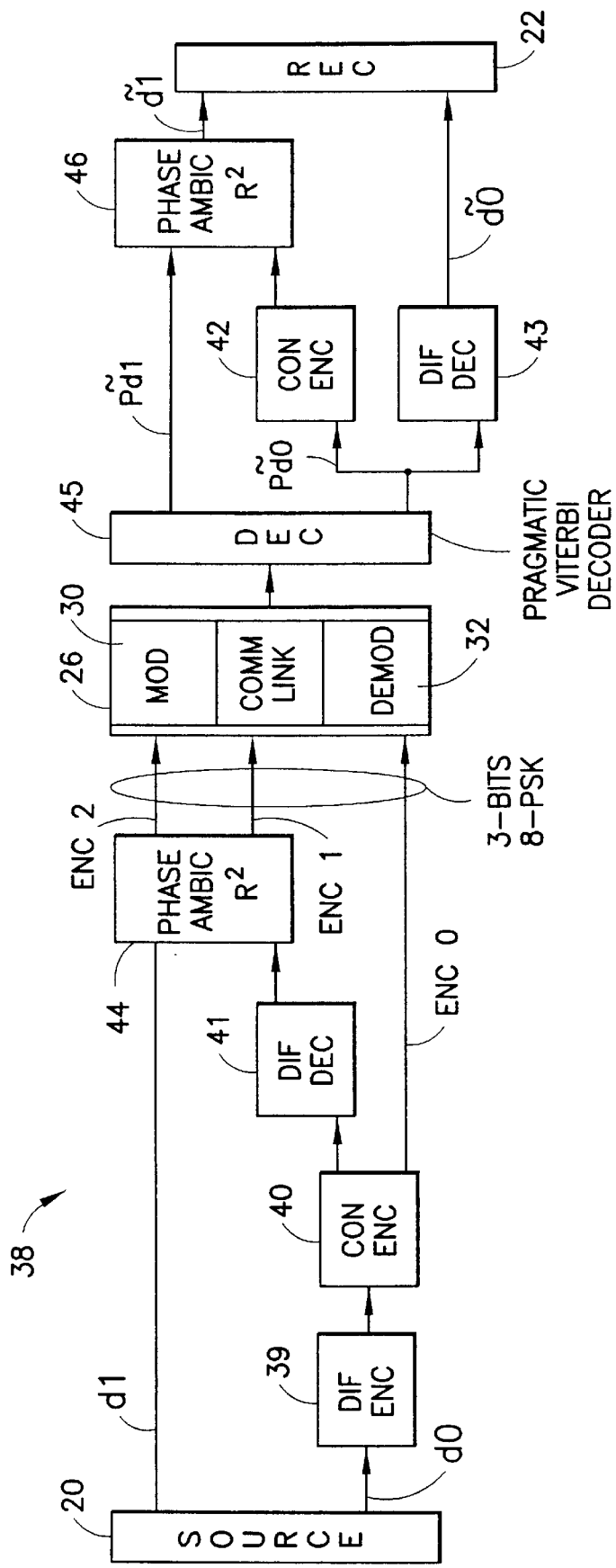
FIG. 1B shows diagrammatically a PSK communication system with error correction coding and correction of phase ambiguities in accordance with a preferred embodiment of the invention.

FIG. 1B shows a communication system 38 in accordance with a preferred embodiment of the invention for the case of 8-PSK. The system 38 includes the data source 20, the data receiver 22 and the mod-demod 26. The system 38 further comprises a one-dimensional differential encoder 39, a convolutional encoder 40, a one-dimensional differential decoder 41, a convolutional encoder 42, a differential decoder 43, a phase-ambiguity operator 44 (indicated in the drawing as $R^2$ for a two-bit signal and $R^3$ for a three-bit signal), a pragmatic Viterbi decoder 45, and a phase-ambiguity inverse operator 46 (indicated in the drawing as $R^2$ for a two-bit signal and $R^3$ for a three-bit signal). The foregoing components are interconnected such that the d0 signal is applied by the source 20 to the differential encoder 39, and thed1 signal is applied by the source 20 to a first input terminal of the operator 44. The output signal of the differential encoder 40 is applied to the input terminal of the convolutional encoder 40 and, after processing by two parallel channels therein (each channel having a well-known circuit topology as taught in Zehavi U.S. Pat. No. 5,428,631 at FIG. 3), is outputted by a first of the channels, as ENC0, to the mod-demod 26 and by a second of the channels to the differential decoder 41. The differential decoder 41 outputs a signal to the second of the input terminals of the operator 44. The operator 44 operates on its two input signals to output two signals, ENC1 and ENC2 to the mod-demod 26. 25 Further details in the construction of these components will be provided in the ensuing description. It is noted that, utilization of both outputs of the encoder 40 has enabled provision of the three signals ENC0, ENC1, and ENC2 to provide the three bits of an 8-PSK signal to the mod-demod 26.

The signal outputted by the mod-demod 26 is applied to the pragmatic Viterbi decoder 45 which, in turn, outputs estimates (indicated by the tilda) of two processed signals Pd0 and Pd1.

The Pd1 signal is applied directly to a first input terminal of the inverse operator 46, and the Pd0 signal is applied via the convolutional encoder 42 to the second input terminal of the inverse operator 46. The inverse operator 46 outputs an estimate of d1 to the receiver 22. The Pd0 signal of the decoder 45 is applied also, via the differential decoder 43 to the receiver 22, the signal outputted by the decoder 43 being an estimate of do.

In the operation of the system 38, the differential decoder 41 functions in the manner of the inverse operation of the operator 44 so as to make the interconnection between the second output terminal of the encoder 40 and the mod-demod 26 transparent. The encoder 39 and the decoder 41 also function in inverse fashion so as to be transparent in the signal path between the do signal terminal of the source 20 and the operator 44 so that this path sees essentially only the encoder 40. The differential decoder 43 also functions in the manner of the inverse operator 46 so as to provide the inverse operation to both of the signals, d1 and d0, outputted to the receiver 22. As noted above with reference to FIG. 1A, correct operation of the encoder 34 and the decoder 36 is obtained by placing these components next to the mod-demod 26. The same is true for the operator 44 and the inverse operator 46, namely, that correct operation of the phase-ambiguity operator 44 requires that the operator 44 be placed immediately before the modulator 30, and that correct operation of the phase-ambiguity inverse operator 46 requires that the inverse operator 46 be placed immediately after the demodulator 32. This requirement is met by the foregoing arrangement of the circuit components wherein the feature of transparency, in essence, places the encoders and the operators in their correct positions relative to the mod-demod 26.

Figure 5:
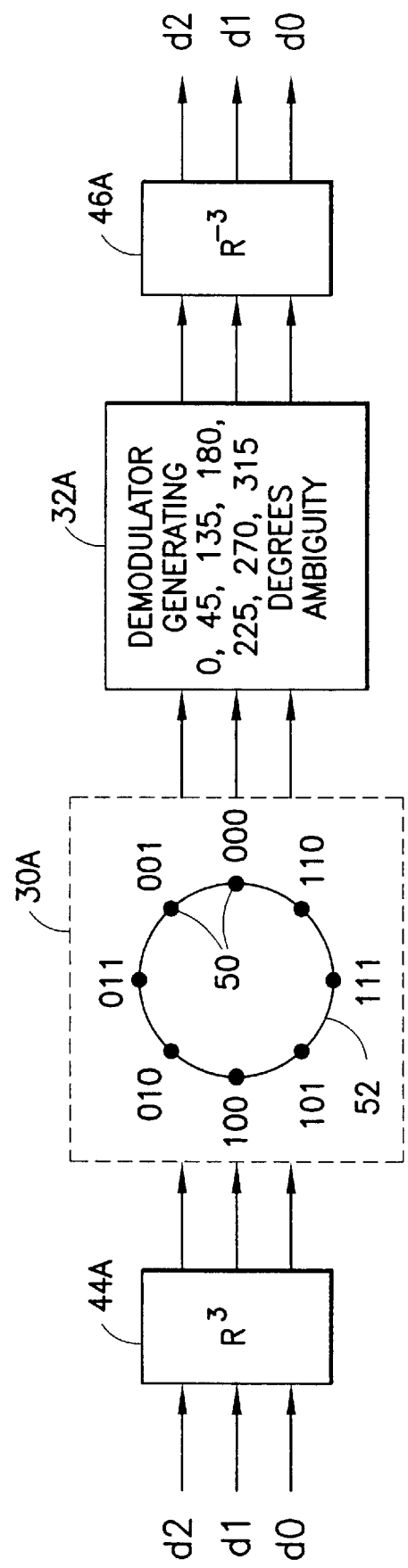
FIG. 5 shows diagrammatically modulation and demodulation portions of a communication system with rotationally invariant uncoded 8-PSK.
Figure 6:
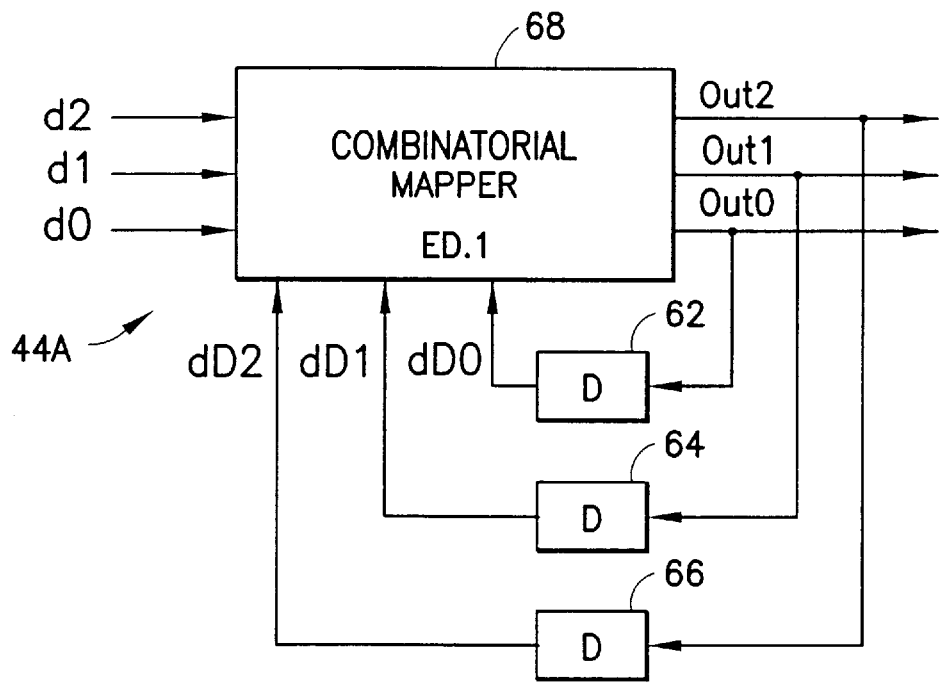
FIG. 6 is a block diagram of an operator of FIG. 5 serving to remove phase ambiguities.
Figure 7:
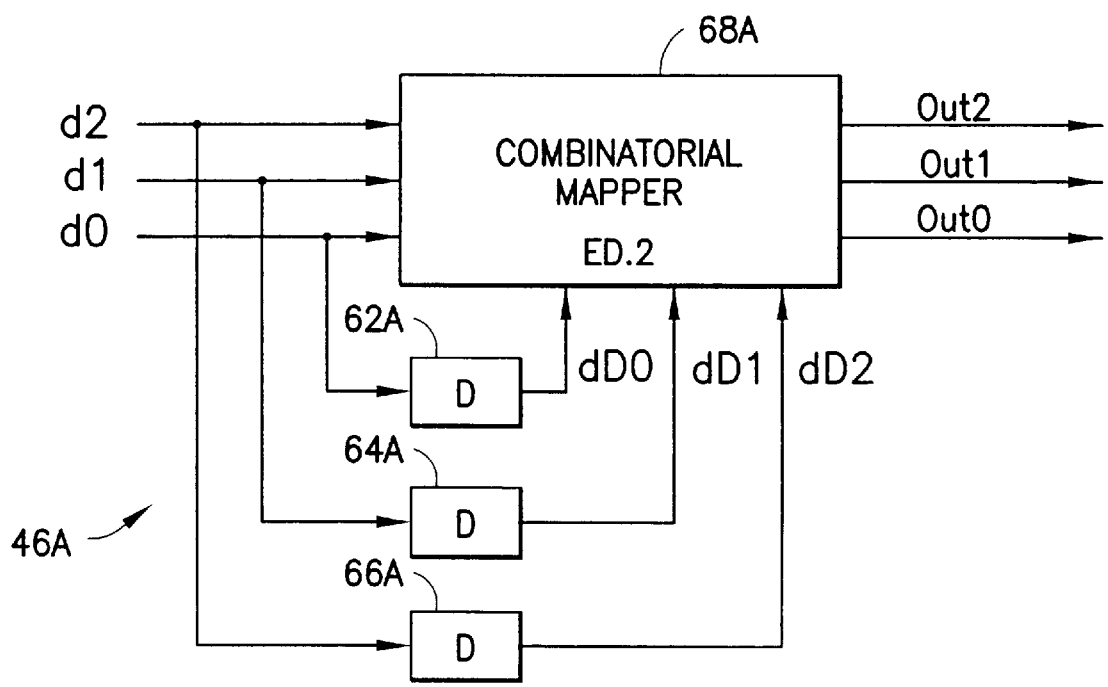
FIG. 7 is a block diagram of an inverse operator of FIG. 5 serving to remove phase ambiguities.

Details in the construction of the circuitry of the operators 44 and 46 and a simplified combination of their circuitry with that of a convolution encoder in a compact embodiment of the invention, as well as an explanation of the operation of the respective circuits is provided now with respect to FIGS. 2–14. FIG. 2 shows a simplified view of FIG. 1B demonstrating only the phase modulation and resolution of phase ambiguities, while FIGS. 3 and 4 show construction of the operator ($R^2$) 44 and the inverse operator ($R^{-2}$) 46 for the case of a two bit signal composed of bits d0 and d1. The description in FIGS. 2, 3 and 4 is based on 2-bit signals while a corresponding description in FIGS. 5, 6 and 7 is based on 3-bit signals. Note that, $R^2$, $R^{-2}$ are used in 8-PSK trellis-coded modulation schemes, where $R^3$ and $R^{-3}$ are used in 16-PSK schemes.

FIG. 2 shows the modulator 30 operating at 4-PSK as indicated by the constellation points 50 on a circle 52, wherein each of the constellation points 50 is identified by a binary number. An input digital signal is applied to the modulator 30 by the operator 44. Signals outputted by the modulator 30 are applied via the communication link 28 to the demodulator 32 which, in turn, applies demodulated signals to the inverse operator 46. This arrangement removes all possible phase ambiguities automatically.

In FIG. 3, the operator 44 comprises a combinatorial mapper 54 which is responsive to two addresses of which one address is the input signal at 56 and the second address is a feedback signal 58. In response to the addressing by the signals 55 and 58, the mapper outputs a signal at 60. Each of the signals 56, 58 and 60 is a two bit signal. The bits of the output signal are feedback via delay units 62 and 64 to provide the feedback signal 58, wherein the bits of the feedback signal 58 are identified further by the letter D to indicate a delaying of the feedback signal by the delay units 62 and 64. The letter D represents a unit delay provided by each of the delay units 62 and 64. The mapper 54 may comprise a read-only-memory (ROM) or a simple combinatorial circuitry represented by the tabulation of data in Table 1.

In FIG. 4, the inverse operator 46 comprises a combinatorial mapper 54A and two delay units 62A and 64A which function in a manner analogous to the corresponding components 54, 62 and 64 of FIG. 3. In FIG. 4, the input signal is applied as an address to the mapper 54A, and is applied also to the delay units 62A and 64A via a feed-forward path to provide feed-forward signals at 58A which also serve to address the mapper 54A. Each of the delay units 62A and 64A imparts a delay of value D. In response to the addressing of the mapper 54A by the signals 56 and 58A, the mapper 54A outputs a signal at 60A. The mapper 54A may comprise a ROM or a simple combinatorial circuitry represented by Table 2.

FIG. 5 shows a modulator 30A operating at 8-PSK as indicated by the constellation points 50 on a circle 52, wherein each of the constellation points 50 is identified by a 3-bit binary number. An input digital signal is applied to the modulator 30 by an operator 44A. Signals outputted by the modulator 30A are applied via the communication link 28 to a demodulator 32A which, in turn, applies demodulated signals to an inverse operator 46A. The arrangement of components of FIG. 5 is the same as that of FIG. 2, except that, in FIG. 5 the components 44A, 30A, 32A, and 46A which are operative with 3-bit signals have been substituted for the corresponding components 44, 30, 32, and 46 of FIG. 2 which are operative with 2-bit signals. This arrangement will remove all possible phase ambiguities equal to integer multiples of 45° automatically.

The circuits of FIGS. 6 and 7 are recognized as having the same configurations as the corresponding circuits of FIGS. 3 and 4. The circuits of FIGS. 6 and 7 are operative with 3-bit signals while the circuits of FIGS. 3 and 4 are operative with 2-bit signals. Thus, in FIG. 6 there are three feedback delay units 62, 64 and 66, and correspondingly, in FIG. 7, there are three feed-forward delay units 62A, 64A and 66A. The 2-bit mappers 54 and 54A of FIGS. 3 and 4 are replaced, in FIGS. 6 and 7 respectively, with 3-bit combinatorial mappers 68 and 68A which operate in a manner analogous to the 2-bit mappers 54 and 54A of FIGS. 3 and 4.

Figure 8:
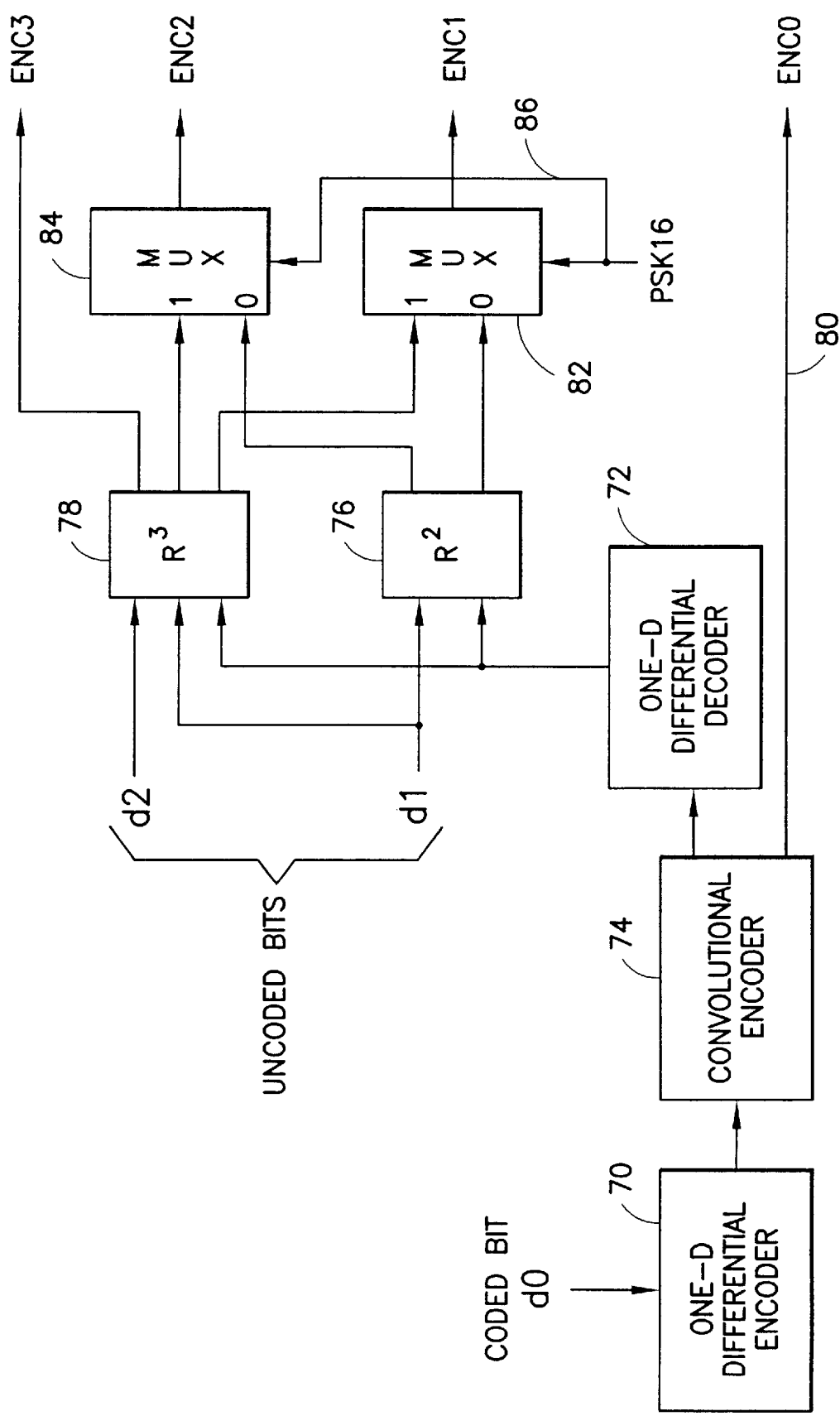
FIG. 8 is a block diagram of the transmission side of the 8-PSK communication system, constructed in accordance with the invention in the form of a differential encoder which serves to remove phase ambiguities.

FIG. 8 shows details in the construction of 8-PSK circuitry of the operator 44 for building the combination of the operator 44 and the inverse operator 46 of FIG. 1B so as to effectively place the error correction encoder 34 immediately before the modulator 30 of the mod-demod block 26. The input 3-bit signal has components d0, d1, and d2. We will refer to d0 as the coded bit and d1, d2 as uncoded bits. The circuitry of FIG. 8 comprises a one-dimensional differential encoder 70, a one-dimensional differential decoder 72, and a convolutional encoder 74 connecting between an output of the encoder 40 and an input of the decoder 72. The d0 signal is applied to the encoder 70. The circuit further comprises both an R operator 76 and an R3 operator 78 which receive a common output signal from the decoder 72. The d1 signal is applied to both of the operators 76 and 78, and the d2 signal is applied only to the operator 78. The convolutional encoder 74 is responsive to a single bit signal applied by the encoder 70 for outputting two signals of which the first signal is the aforementioned signal applied to the decoder 72 and a second signal is outputted on line 80.

Figure 12:
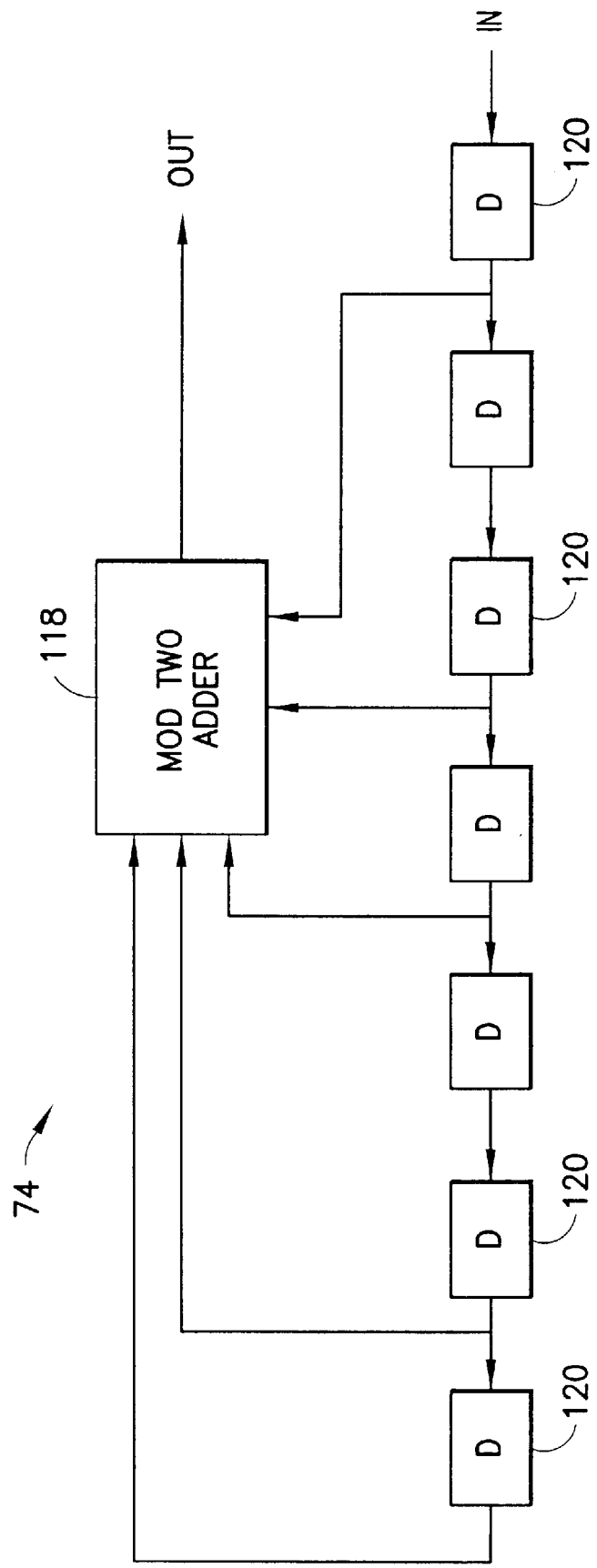
FIG. 12 is a block diagram of one of two branches of a convolutional decoder employed in the circuitry of FIG. 11.

The convolutional encoder 74 has two branches having separate transfer functions, wherein each of the branches is configured generally as shown in the circuitry of FIG. 12. Two of the three output signals of the operator 78 are applied to multiplexers 82 and 84, and both of the output signals of the operator 76 are applied to both of the multiplexers 82 and 84. As explained in Zehavi (U.S. Pat. No. 5,428,631 at FIG. 1) and Wolf (U.S. Pat. No. 5,233,630 at FIG. 2), a 2-bit signal composed of d0 and d1 is employed to encode a 3-bit signal composed of ENC0, ENC1, and ENC2 for 8-PSK modulation; and a 3-bit signal composed of d0, d1 and d2 is employed to encode a 4-bit signal composed of ENC0, ENC1, ENC2, and ENC3 for 16-PSK modulation. The circuitry of FIG. 8 is operative to make the foregoing signals for 8-PSK and 16-PSK modulation from the signals d0, d1 and d2.

The multiplexers 82 and 84, which are operative in response to a logic-1 signal on line 86, select the requisite bits to output either an 8-PSK or 16-PSK modulation by selection of output signals from the operators 76 and 78. The second signal outputted by the convolutional encoder 74 is designated ENC0, multiplexer 82 outputs ENC1, multiplexer 84 outputs ENC2, and the most significant bit outputted by operator 78 is ENC3.

Figure 9:
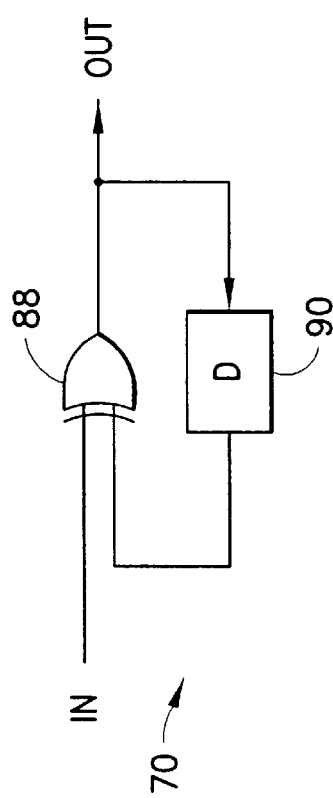
FIG. 9 shows the circuit of a one-dimensional differential encoder employed in the circuitry of FIG. 8.

With reference to FIG. 9, the one-dimensional differential encoder 70 comprises an exclusive-OR gate 88 and a delay unit 90. An input signal is applied to one input terminal of the gate 88. The delay unit 90 provides a feedback path between the output terminal of the gate 88 and a second input terminal of the gate 88. The delay unit 90 imparts a delay of value D to the feedback signal.

Figure 10A:
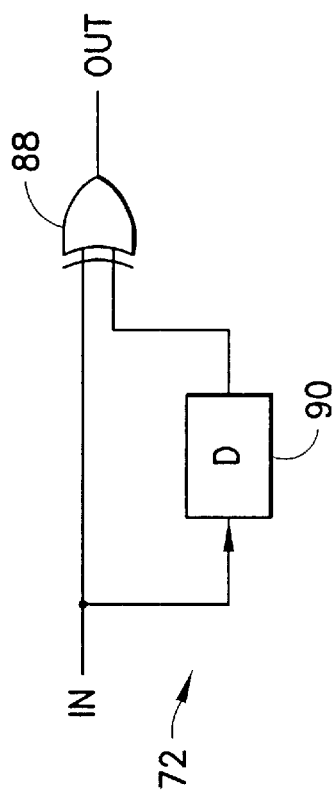
FIG. 10A shows a first embodiment of the circuit of a one-dimensional differential decoder employed in the circuitry of FIG. 8.
Figure 10B:
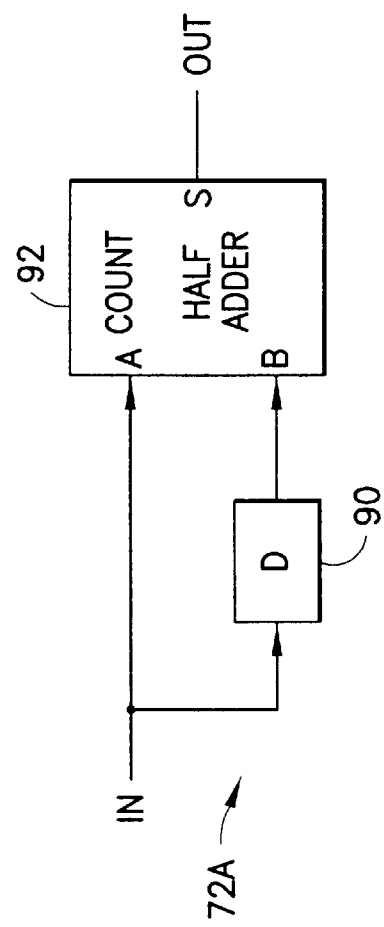
FIG. 10B shows a second embodiment of the circuit of a one-dimensional differential decoder employed in the circuitry of FIG. 8.

With reference to FIGS. 10A and 10B, there are shown, respectively, the circuits of the one-dimensional differential decoder 72 and an alternative embodiment indicated as one-dimensional differential decoder 72A. In FIG. 10A, the decoder 72 comprises the gate 88 and the delay unit 90. The input signal is applied directly to one input terminal of the gate 88, and is applied via the delay unit 90 to the second input terminal of the gate 88. The output signal of the decoder 72 is taken from the output of the gate 88. In FIG. 10B, the decoder 72A comprises a half adder 92 and the gate 90. The input signal is applied to one input terminal of the half adder 92, and is applied via the delay unit 90 to the second input terminal of the half adder 92. The output signal of the decoder 72A is taken from the output of the half adder 92.

Figure 11:
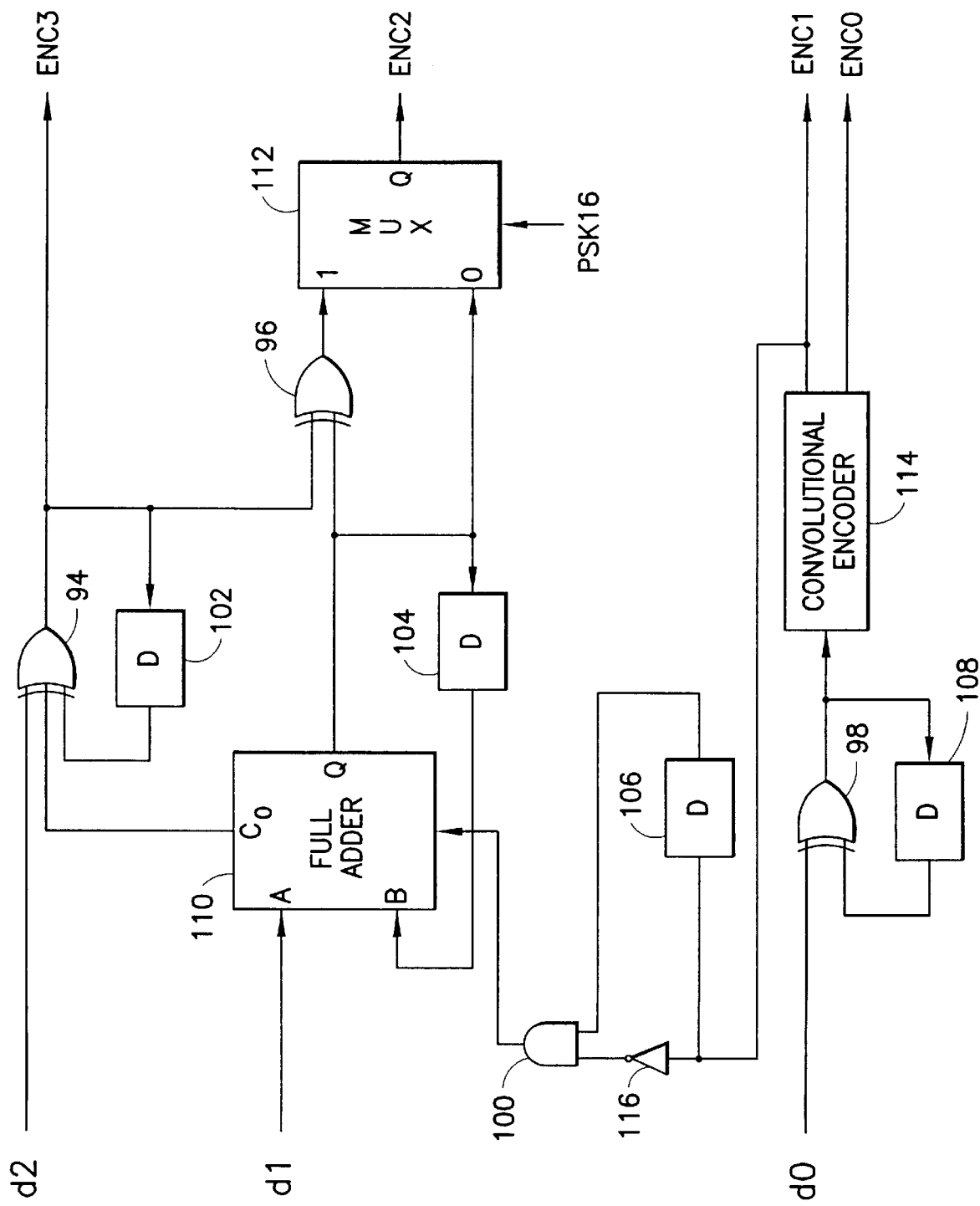
FIG. 11 is a block diagram of a simplified embodiment of the circuitry of FIG. 8 used as the transmission side of the PSK communication system, the circuitry of FIG. 11 being constructed in the form of a differential encoder which serves to remove phase ambiguities.

In accordance with a feature of the invention, the circuitry of FIG. 8 can be simplified as shown in FIG. 11. The circuit of FIG. 11 comprises three exclusive-OR gates 94, 96, and 98, and an AND gate 100. Also included are four delay units 102, 104, 106 and 108 each providing a delay of value D. The circuit further comprises a full adder 110, a multiplexer 112, a convolutional encoder 114, and an inverter 116. The delay unit 108 provides a feedback path between an output terminal of the gate 98 and one of its input terminals, the other input terminal receiving the input signal d0. The combination of the gate 98 and the delay unit 108 function as an encoder in a manner analogous to the operation of the circuit of FIG. 9. The output terminal of the gate 98 connects with an input terminal of the convolutional encoder 114 which functions in the manner of the encoder 74 (FIG. 8) to output signals ENC0 and ENC1.

The ENC 1 signal is applied via the inverter 116 to one input terminal of the AND gate 100. The ENC 1 signal is applied also via the delay unit 106 to the second input terminal of the AND gate 100. The output signal of the AND gate 100 is applied to a clock (Ci) input terminal of the full adder 110. The output signal of the adder 110 (terminal Q) is fed back via delay unit 104 to input terminal B of the adder 110. The input signal d1 is applied to input terminal A of the adder 110. The input signal d2 is applied to a first of three input terminals of the gate 94. A clock signal, outputted at terminal Co of the adder 110, is applied to a second of the input terminals of the gate 94. An output signal of the gate 94 is fed back via the delay unit 102 to the third input terminal of the gate 94. The output signal of the gate 94 is applied also to one input terminal of the gate 96. The output signal of the adder 110 (terminal Q) is applied to the second input terminal of the gate 96, and is applied also to an input (terminal 0) of the multiplexer 112. The output signal of the gate 96 is applied to an input (terminal 1) of the multiplexer 112. The output signal of the multiplexer 112 serves as the ENC2 signal, and the output signal of the gate 94 serves as the ENC3 signal.

With reference to FIG. 12, there is shown one of two branches of the convolutional encoder 74, the branch comprising a modulo-2 adder 118 and a set of serially connected delay units 120. An input signal propagates sequentially through respective ones of the delay units 120, each of which imparts an equal amount of delay D to the input signal. Signals appearing at output terminals of various ones of the delay units 120 are tapped and applied to the adder 118. Each of the branches of the encoder 74 has the same general configuration as that shown in FIG. 12, but differs in the selection of signals to be tapped from the output terminals of the various delay units 120. The sum of the signals provided by the adder 118 serves as the output signal of the encoder 74.

Figure 13:
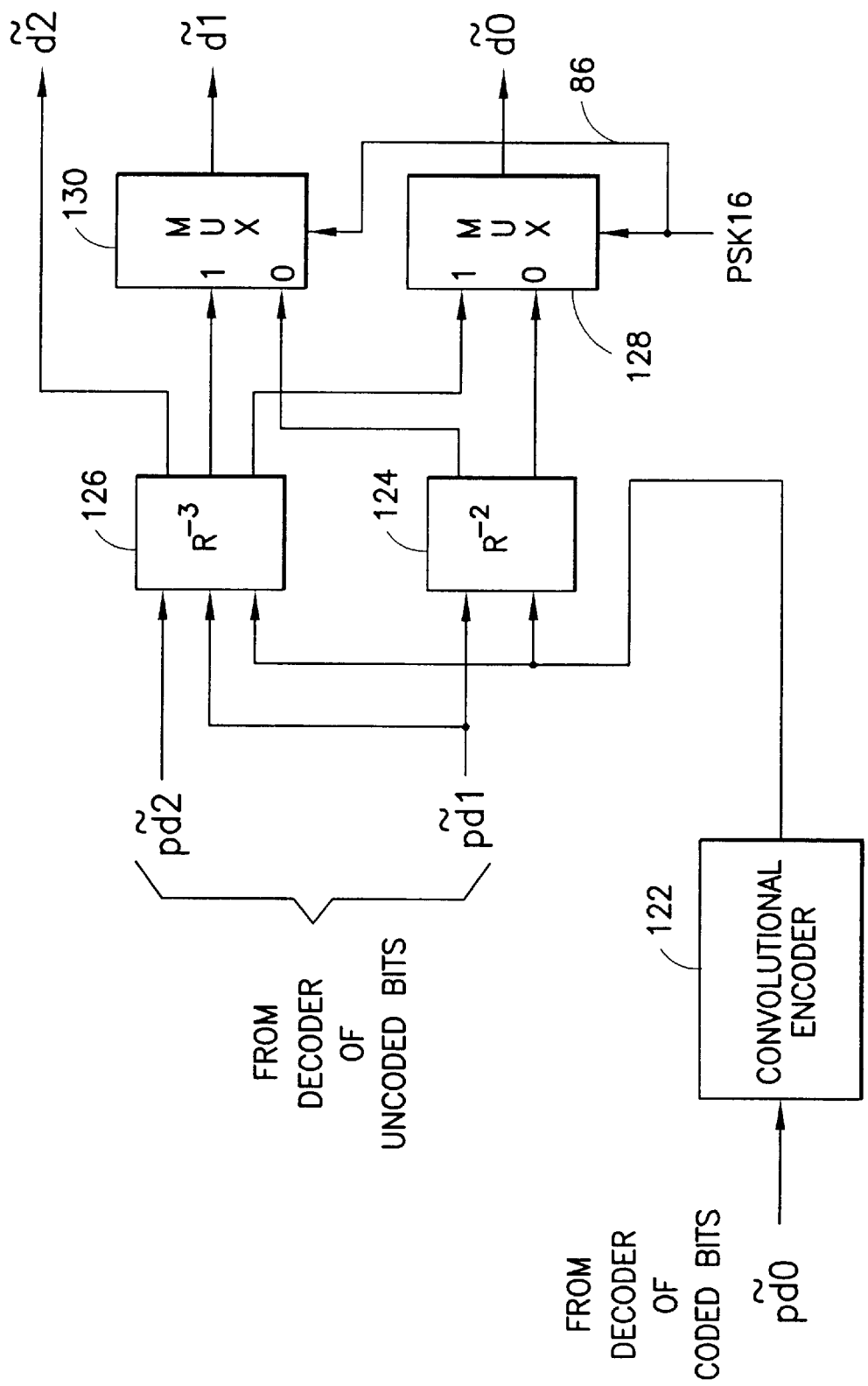
FIG. 13 is a block diagram of the reception side of the 8-PSK communication system, constructed in accordance with the invention in corresponding manner to the circuitry of FIG. 8, and having the form of a differential decoder which serves to remove phase ambiguities.

FIG. 13 shows details in the construction of 8-PSK circuitry of the inverse operator 46 for building the combination of the operator 44 and the inverse operator 46 of FIG. 1B so as to effectively place the error correction decoder 36 immediately after the demodulator 32 of the mod-demod block 26. The input 3-bit signal has estimates of components pd0, pd1, and pd2. The circuitry of FIG. 13 comprises a convolutional encoder 122, an inverse operator ($R^{-2}$) 124, an inverse operator ($R^{-3}$) 126, and two multiplexers 128 and 130. The convolutional encoder 122 has the same general configuration of the encoder 74 (FIGS. 8 and 12) but wherein only one output branch is employed, this being the circuitry as shown in FIG. 12. The single output of the encoder 122 connects with each of the inverse operators 124 and 126. The pd0 signal is applied to the encoder 122. The pd1 signal is applied to both of the inverse operators 124 and 126, and the pd2 signal is applied only to the inverse operator 126.

The multiplexers 128 and 130, which are operative in response to the logic-1 signal on line 86 (previously described in FIG. 8), select the requisite bits to output either an 8-PSK or 16-PSK modulation by selection of output signals from the inverse operators 124 and 126. The multiplexer 128 outputs an estimate of d0 and the multiplexer 130 outputs an estimate of d1 to provide the bits for an 8-PSK signal. For the 16-PSK, the signal on line 86 activates the multiplexers 128 and 130 to output the requisite values of d0 and d1, and wherein the third output signal of the inverse multiplexer 126 is employed to complete the set of signals for the 16-PSK.

Figure 14:
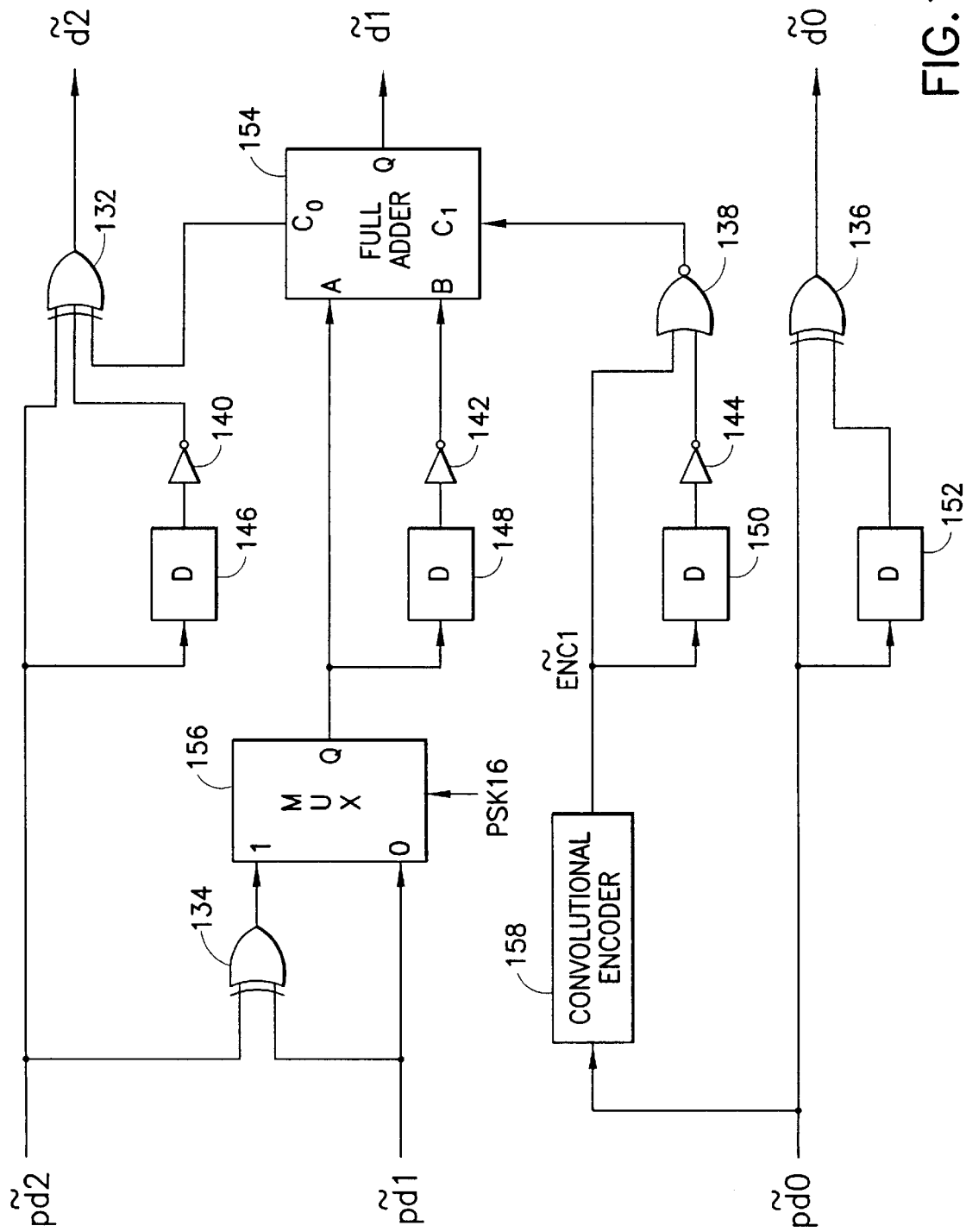
FIG. 14 is a block diagram of a simplified embodiment of the circuitry of FIG. 13 used as the reception side of the PSK communication system, the circuitry of FIG. 14 being constructed in the form of a differential decoder which serves to remove phase ambiguities.

In accordance with a feature of the invention, the logical operations of FIG. 13 can be attained by the circuit shown in FIG. 14. The circuit of FIG. 14 comprises three exclusive-OR gates 132, 134, and 136, a NOR gate 138, and three inverters 140, 142, and 144. Also included are four delay units 146, 148, 150, and 152 each providing a delay of value D. The circuit further comprises a full adder 154, a multiplexer 156, and a convolutional encoder 158. Estimates of three input signals pd0, pd1 and pd2 are inputted to the circuit of FIG. 14, and the circuit outputs estimates of corresponding signals d0, d1 and d2.

The OR gate 132 has three input terminals for receiving, namely, pd2 estimate applied directly to an input terminal, the pd2 estimate applied via the delay unit 146 and the inverter 140 to a second input terminal, and an output clock signal from the adder 154 at the third input terminal. The estimates of the pd1 and the pd2 signals are applied via the gate 134 to one of two input terminals of the multiplexer 156, and the estimate of the pd1 signal is applied also directly to a second of the input terminals of the multiplexer 156. The encoder 158 has the same construction as the encoder 122 (FIG. 13), and receives as input signal the estimate of the pd0 signal. The output signal of the encoder 158 is applied directly to one of two input terminals of the gate 138, and is applied also to the second input terminal of the gate 138 via the delay unit 150 and the inverter 144 to provide the function of a decoder. An output signal of the gate 138 is applied to the clock input terminal of the adder 154.

The output signal of the multiplexer 156 is applied directly to one input signal terminal of the adder 154, and is applied to a second signal input terminal of the multiplexer 154 via the delay unit 148 and the inverter 142. The estimate of the pd0 signal is applied to an input terminal of the gate 136, and is applied also to a second input terminal of the gate 136 via the delay unit 152 to provide the function of a decoder. The output signal of the gate 136 is the estimate of the d0 signal, the output signal of the adder 154 is the estimate of the d1 signal, and the output signal of the gate 132 is the estimate of the d2 signal.

The operation of the invention is described further as follows.

With reference to FIG. 2, the phase of the oscillator in the transmitter and receiver might be offset by integer multiples of 45 and 22.5 degrees for the 8-PSK modulations, respectively. One approach to combat this problem is to transmit a known data pattern occasionally and monitor the state of the pattern and, in the case of occurrence of phase ambiguity, perform the necessary corrections to the received data. Another approach is to design differential encoder/decoders that will automatically remove the ambiguities and recover the correct data. The invention employs the latter approach which will be explained in detail.

In 8-PSK modulation, odd multiples of 45 degrees phase ambiguities (i.e. 45, 135, 225, and 315 degrees), and in 16-PSK odd multiples of 22.5 degrees can be easily detected in the main core of a Viterbi decoder due to the occurrence of exceptionally large number of errors.

However, in the case of 8-PSK phase ambiguities of even multiples of 45 degrees, i.e. 90 180, and 270 degrees, and in the case of 16-PSK phase ambiguities of even multiples of 22.5 degrees, i.e. 45, 90, 135, 180, 225, 270, 315 degrees, the ambiguities can not be detected. The codecs disclosed herein automatically remove these ambiguities.

The operation of these codes is based on the phase ambiguity removal in uncoded QPSK and 8-PSK modulation schemes. The block diagram of rotationally invariant uncoded gray-encoded 4-PSK modulation which is immune to 0,90,180 and 270 degrees of phase ambiguity is shown in FIG. 2. The design of $R^2$ and $R^{-2}$ are shown in FIG. 3 and FIG. 4, respectively. The truth tables of combinatorial circuits in $R^2$ and $R^{-2}$ are given in Table 1 and Table 2, respectively. In the case of phase ambiguities at the receiver, the decoder extracts the correct data except for the loss of some (unessential) initial data bits.

For uncoded 8PSK systems the $R^2$ and $R^{-2}$ modules are replaced with 3-dimensional differential encoder/decoder pairs, i.e. $R^3$ and $R^{-3}$. FIG. 5 shows the block diagram of an uncoded 8-PSK modulation scheme which is rotationally invariant to 0,45,90,135,180,225, 270, and 315 degrees phase ambiguities. The block diagram of the $R^3$ and $R^{-3}$ modules are shown in FIG. 6 and FIG. 7, respectively. The mappings for the combinatorial circuits in FIGS. 6 and 7 are shown in equations 1 and 2 respectively. Use of these equations gives tabulated data corresponding to the data of Tables 1 and 2, but for 3-bit signals rather than the 2-bit signal data of Tables 1 and 2.

TABLE 1

Truth table of Combinatorial circuit in $R^2$

| (DD1.DD0) | (D1.D0) | (OUT1.OUT0) |
|---|---|---|
| 00 | 00 | 00 |
| 00 | 01 | 01 |
| 00 | 10 | 10 |
| 00 | 11 | 11 |
| 01 | 00 | 01 |
| 01 | 01 | 11 |
| 01 | 10 | 00 |
| 01 | 11 | 10 |
| 10 | 00 | 10 |
| 10 | 01 | 00 |
| 10 | 10 | 11 |
| 10 | 11 | 01 |
| 11 | 00 | 11 |
| 11 | 01 | 10 |
| 11 | 10 | 01 |

TABLE 1-continued

Truth table of Combinatorial circuit in $R^2$

| (DD1.DD0) | (D1.D0) | (OUT1.OUT0) |
|---|---|---|
| 11 | 11 | 00 |

TABLE 2

Truth table of Combinatorial circuit in $R^2$

| (DD1.DD0) | (D1.D0) | (OUT1.OUT0) |
|---|---|---|
| 00 | 00 | 00 |
| 00 | 01 | 01 |
| 00 | 10 | 10 |
| 00 | 11 | 11 |
| 01 | 00 | 10 |
| 01 | 01 | 00 |
| 01 | 10 | 01 |
| 01 | 11 | 11 |
| 10 | 00 | 11 |
| 10 | 01 | 10 |
| 10 | 10 | 01 |
| 10 | 11 | 01 |
| 11 | 00 | 01 |
| 11 | 01 | 11 |
| 11 | 10 | 11 |
| 11 | 11 | 10 |

EQUATION (1)

(OUT2, OUT1, OUT0)=(D2, D1, D0)+(DD2, DD1, DD0) MOD 8

EQUATION (2)

(OUT2, OUT1, OUT0)=(D2, D1, D0)+complement of (DD2, DD1, DD0) MOD 8

One of the main feature of the systems shown in FIG. 2 and FIG. 5 is that the outputs of operators $R^2$ and $R^3$ are fed to the modulator directly. In case of addition of error-correcting coding to the system, outputs of the encoder should also be directly fed to the modulator. This is the main challenge of the design of differential codecs for 8 and 16-PSK pragmatic codes, such that outputs of both operators $R^2$ or $R^3$ and convolutional encoder are directly applied to the modulator.

In accordance with the invention, this objective is met as follows: The $R^2$ or $R^3$ differential encoders are preceded by the convolutional encoder. However, one output of the convolutional encoder is applied to an inverse function of $R^2$ or $R^3$ before being applied to $R^2$ or $R^3$, as shown in FIG. 8. The coded bit is applied to convolutional encoder. The ENC1 output of convolutional encoder and the uncoded bit(s) d1 and d2 are applied to $R^2$ or $R^3$ (16-PSK). To be able to satisfy the criteria that the output of convolutional encoder needs to be supplied to the modulator directly, there is an insertion of the inverse function of $R^2$ or $R^3$ on the lower bit between the convolutional encoder and $R^2$ or $R^3$. The inverse of $R^2$ or $R^3$ on the lowest bit is simply a single bit differential decoder. Therefore, the circuitry comprises the convolutional encoder, a one-dimensional differential decoder, $R^2$ and $R^3$ as shown in FIG. 8. Since the coded bit is applied to the convolution encoder directly, to protect this bit against phase ambiguity a one dimensional differential encoder is used. Design of one-dimensional differential encoder/decoder are shown in FIGS. 9 and 10, respectively.

After analyzing the operation of $R^2$, $R^3$, and one-dimensional differential decoder some redundant circuitry is removed from the design to yield the final simplified encoder circuitry shown in FIG. 11.

The decoding operation is a straight forward inverse operation of the encoder. The estimate of the coded bit is applied to convolutional encoder to create an estimate of ENC1 bit through the generator function of FIG. 12. The estimate of ENC1 in conjunction with the original estimates on uncoded bits are used to generate final estimates of the transmitted uncoded information bits d1 in the case of 8-PSK, or d1 and d2 in the case of 16-PSK as shown in FIG. 13.

Similar to the design of the encoder, redundant circuitry exists in the decoder, upon removal of the redundant circuitry a simplified decoder is obtained.

The simplified decoder design is shown in FIG. 14. The coded bit, d0, is protected against the phase ambiguities with a single bit differential encoder and decoder.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. An error correction phase-shift-keying communication system with removal of phase ambiguities, comprising:

a communication channel having a phase modulator at an input side of the channel and a phase demodulator at an output side of the channel;

a signal preprocessor and a differential encoder, the preprocessor comprising an error correction unit for correction of errors in signal generation, the differential encoder being connected between an output terminal of the preprocessor and an input terminal of the modulator;

a signal post processor and a differential decoder, the differential decoder being connected between an output terminal of the demodulator and an input terminal of the post processor; and wherein an operational function of the differential decoder is inverse to an operational function of the differential encoder to provide for removal of a phase ambiguity produced within the signal channel; and the processor of each of said preprocessor and said post processor comprises a one-dimensional coder and a convolutional encoder serially connected to each other for processing a least significant bit of an input signal of said processor to provide an output digit of an output signal of said processor; and logic means including a full adder responsive to the output signal of said convolutional encoder and the next more significant bit of the input signal of said processor to provide a further digit of the output signal of said processor.

2. A system according to claim 1 further comprising:

a first compensation unit located in said preprocessor and having an operational function inverse to the operational function of said differential encoder to provide for a virtual direct connection between said error correction unit and said modulator;

a second compensation unit located in said post processor and having an operational function inverse to the operational function of said first compensation unit; and wherein said second compensation unit is operative to remove a signal perturbation introduced by said first compensation unit.

3. An error correction phase-shift-keying communication system with removal of phase ambiguities, comprising:

a communication channel having a phase modulator at an input side of the channel and a phase demodulator at an output side of the channel;

a first error correction unit for correction of errors in signal generation, the error correction unit preceding said modulator, a second error correction unit for correction of errors in signal generation, said second error correction unit following said demodulator;

a first phase ambiguity resolving means interconnecting said correction unit with said modulator and having a first operator, and a second phase ambiguity resolving means interconnecting said second correction unit with said demodulator and having a second operator inverse to said first operator, each of said operators comprising means for performing logic operations of a mapping process including a combination of an input signal of said operator with a delayed signal wherein said delayed signal is the input signal of said operator or an output signal of said operator; and wherein said first error correction unit and said first phase ambiguity resolving means constitute a first ambiguity resolving circuit, and said second error correction unit and said second phase ambiguity resolving means constitute a second ambiguity resolving circuit, each of said resolving circuits comprising a one-dimensional coder and a convolutional encoder serially connected to each other for processing a least significant bit of an input signal of said resolving circuit to provide an output digit of an output signal of said resolving circuit; and logic means including a full adder responsive to the output signal of said convolutional encoder and the next more significant bit of the input signal of said resolving circuit to provide a further digit of the output signal of said resolving circuit.

4. A system according to claim 3 wherein, in said first operator, said delayed signal is a delayed replica of the output signal of said first operator.

5. A system according to claim 4 wherein, in said second operator, said delayed signal is a delayed replica of the input signal of said second operator.

6. An error correction phase-shift-keying communication system with removal of phase ambiguities, comprising:

a communication channel having a phase modulator at an input side of the channel and a phase demodulator at an output side of the channel;

an error correction unit for correction of errors in signal generation, the error correction unit preceding said modulator;

phase ambiguity resolving means interconnecting said correction unit with said modulator, and comprising an operator for performing logic operations of a mapping process including a combination of an input signal of said operator with a delayed replica of output signal of said operator; and wherein said error correction unit and said phase ambiguity resolving means constitute an ambiguity resolving circuit comprising a one-dimensional encoder and a convolutional encoder coupled to an output terminal of said one-dimensional decoder for processing a least significant bit of an input signal of said resolving circuit to provide an output digit of an output signal of said resolving circuit; and logic means including a full adder responsive to the output signal of said convolutional decoder and the next more significant bit of the input signal of said resolving circuit to provide a further digit of the output signal of said resolving circuit.

7. A system according to claim 6 wherein said logic means includes OR means for combining an encoded replica of a third digit of the input signal of said resolving circuit with an output signal of said full adder to provide a further digit of the output signal of said resolving circuit.

8. A system according to claim 3 wherein said first error correction unit is an encoder and said second error correction unit is a decoder.

9. A system according to claim 8 wherein, in said first operator, said delayed signal is a delayed replica of the output signal of said first operator.

10. A system according to claim 9 wherein, is said second operator, said delayed signal is a delayed replica of the input signal of said second operator.

11. A system according to claim 10 wherein said second ambiguity resolving circuit comprises a one-dimensional decoder coupled to an input terminal of said resolving circuit for processing a least significant bit of an input signal of said resolving circuit to provide an output digit of an output signal of said resolving circuit.

12. An error correction phase-shift-keying communication system with removal of phase ambiguities, comprising:

a communication channel having a phase modulator at an input side of the channel and a phase demodulator at an output side of the channel;

a first error correction unit for correction of errors in signal generation, the first error correction unit preceding said modulator, and a second error correction unit for correction of errors in signal generation, said second error correction unit following said demodulator;

a first phase ambiguity resolving means interconnecting said correction unit with said modulator and having a first operator, and a second phase ambiguity resolving means interconnecting said second correction unit with said demodulator and having a second operator inverse to said first operator, each of said operators comprising means for performing logic operations of a mapping process including a combination of an input signal of said operator with a delayed signal wherein said delayed signal is the input signal of said operator or an output signal of said operator;

wherein said first error correction unit is an encoder and said second error correction unit is a decoder, said delayed signal for said first operator is a delayed replica of the output signal of said first operator, said delayed signal for said second operator is a delayed replica of the input signal of said second operator;

said second error correction unit and said second resolving means constitute an ambiguity resolving circuit comprising a one-dimensional decoder coupled to an input terminal of said resolving circuit for processing a least significant bit of an input signal of said resolving circuit to provide an output digit of an output signal of said resolving circuit;

said one-dimensional decoder is a first one-dimensional decoder, the system further comprising:

logic means including a full adder, and a second one-dimensional decoder and a convolutional encoder coupled to an output terminal of said second one-dimensional decoder for processing the least significant bit of the input signal of said resolving circuit to provide a clock input to said full adder; and wherein said logic means includes OR means for combining more significant bits of the input signal of said resolving circuit for application to said adder to provide a further digit of the output signal of said resolving circuit.

* * * * *